(12) United States Patent
Nagata

(10) Patent No.: US 6,399,494 B1
(45) Date of Patent: Jun. 4, 2002

(54) METHOD OF MAKING A SEMICONDUCTOR DEVICE

(75) Inventor: Toshio Nagata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/945,756

(22) Filed: Sep. 5, 2001

(30) Foreign Application Priority Data

Nov. 28, 2000 (JP) ........................................ 2000-360989

(51) Int. Cl.$^7$ ................................................. H01L 21/44
(52) U.S. Cl. ................................ 438/682; 257/382
(58) Field of Search ................................ 438/625, 636, 438/655, 682; 257/382

(56) References Cited

U.S. PATENT DOCUMENTS

| | | | |
|---|---|---|---|
| 6,103,610 A | * | 8/2000 | Blair ........................... 438/592 |
| 6,136,705 A | * | 10/2000 | Blair ........................... 438/682 |
| 6,146,542 A | * | 11/2000 | Ha et al. ........................ 216/2 |
| 6,207,563 B1 | * | 3/2001 | Wieczorek et al. ......... 438/664 |
| 6,339,245 B1 | * | 1/2002 | Maa et al. ................... 257/382 |

FOREIGN PATENT DOCUMENTS

| | | | | |
|---|---|---|---|---|
| JP | 9-232253 | * | 9/1997 | ........... H01L/21/28 |
| JP | 2000-114515 | * | 4/2000 | ........... H01L/29/78 |

* cited by examiner

*Primary Examiner*—Olik Chaudhuri
*Assistant Examiner*—David S Blum
(74) *Attorney, Agent, or Firm*—Kanesaka & Takeuchi

(57) ABSTRACT

A method of making a semiconductor device comprises forming a gate electrode on a semiconductor substrate, forming a diffusion layer in the semiconductor substrate, forming a first SiO2 film on a bottom surface of the semiconductor substrate and second SiO2 film on an upper surface of the semiconductor substrate, removing the second SiO2 film, forming a CoSi2 film on the diffusion, and removing an undesired cobalt from the first SiO2 film.

7 Claims, 3 Drawing Sheets

METHOD OF MAKING A SEMICONDUCTOR DEVICE

BACKGROUND OF THE INVENTION

1. Field of the Invention

The present invention relates to processes for producing semiconductor devices and, particularly, to a process for producing semiconductor devices while preventing contamination otherwise produced during low pressure-chemical vapor deposition (LP-CVD).

2. Description of the Related Art

Where semiconductor devices, such as dynamic random access memories (DRAMs), are produced, interconnections on the surface of an n+diffusion layer are made of polysilicon. One way to provide high speed, high-density semiconductor devices is further miniaturization of the devices. For example, a DRAM having a gate length of 0.18 um or less is being developed. To reduce the resistance between the n+diffusion layer and the interconnection in the contact area of a DRAM, tungsten interconnection has been proposed. However, for the 0.18 um or less device, the resistance between the tungsten interconnection and the n+diffusion layer is still too high, and further reduction is demanded. For this reason, cobalt silisicide (CoSi2) has been provided between the n+diffusion layer and the tungsten interconnection.

However, after the CoSi2 film is formed on the n+diffusion layer, it is necessary to form an insulation film, such as silicon nitride (SiN) film, on the CoSi2 film. This is made by LP-CVD. The structure or intermediate structure obtained by LP-CVD has a CoSi2 film. Consequently, the back side of the structure can be contaminated by the heavy metal adhering to the carrier used in the heavy metal process wherein the heavy metal or cobalt is used. The inventors have confirmed that the amount of a heavy metal, such as tungsten or titanium, adhering to the back side of the structure is not more than 10 atoms/cm . If such a structure is put into a LP-CVD reaction furnace, the quartz component or dummy wafer in the structure would be contaminated. In addition, where the LP-CVD is batch processed, other devices in the batch process are contaminated. This contamination leads to impairment of the device electrical characteristics.

SUMMARY OF THE INVENTION

Accordingly, it is an object of the invention to provide a process for producing a semiconductor device capable of preventing contamination of the device in the LP-CVD process that is performed after the heavy metal process.

According to the invention there is provided a process for producing a semiconductor device including a heavy metal step wherein a heavy metal is used, comprising the steps of depositing an insulation film on a back side of a structure prior to the heavy metal step; and removing from the insulation film the heavy metal that has adhered to the insulation film in the heavy metal step.

Since the insulation film is formed on the back side of a structure prior to the heavy metal process, the insulation film, to which undesired heavy metal adheres, prevents the heavy metal from diffusing into the structure. The heavy metal is removed from the insulation film prior to the next step so that contamination, by the heavy metal, of the components of a structure is avoided. Also, contamination of the other structures in the same batch is avoided.

It is preferred that the insulation film has a thickness of 10–20 nm. If the film thickness is too large, the formation time is so long that the amount of particles is increased too much to be practical. Thus, it is preferred that the film thickness be no more than 20 nm. To make the insulation even in thickness and high in quality, it is preferred that the film thickness be no less than 10 nm.

Also, it is preferred that the insulation film is an oxide film. An example of the substrate for the structure is a silicon substrate, on the back side of which the oxide film is formed. Then, the structure is subjected to the process with a heavy metal. As a result, the heavy metal adheres to the oxide film. The bonding force between the oxide film and the heavy metal is weaker than that between the silicon substrate and the heavy metal so that the heavy metal can be readily removed with hydrogen fluoride (HF) or the like. Since there is the oxide film between the heavy metal and the substrate, it is possible to suppress diffusion of the heavy metal into the substrate. Where the oxide film is formed by LP-CVD, the oxide film becomes rich with silicon in the first 2–3 nm layer. Consequently, to form a stoichiometric SiO2 film, it is necessary to make the film at least 10 nm thick.

Alternatively, it is preferred that the insulation film is a nitride film. If the substrate is a silicon substrate, the nitride film is formed on the back side of the silicon substrate. Then, the structure is subjected to the process with a heavy metal. As a result, the heavy metal adheres to the nitride film. The chemical bond between silicon and nitrogen of the SiN film is incomplete in comparison with the chemical bond between silicon and oxygen of the SiO2 film so that the heavy metal is bonded with silicon of the nitride film with a strong force. Consequently, there is no danger that the adhered heavy metal diffuses into the silicon substrate from the nitride film. Then, the heavy metal is lifted off together with the nitride surface layer with HF or the like.

Where the insulation film is either oxide or nitride film, it is easy to remove the heavy metal from the surface with HF. More specifically, the structure with the insulation film is immersed in a 0.3% HF solution for 60 seconds to remove the heavy metal.

Then, the insulation film may be removed. This is also achieved by wet etching with HF.

DESCRIPTION OF THE PREFERRED EMBODIMENTS

Embodiments of the invention will now be described with reference to the accompanying drawing, wherein the contact area of a DRAM having a gate length of 0.18 um is shown.

Figure 1A:
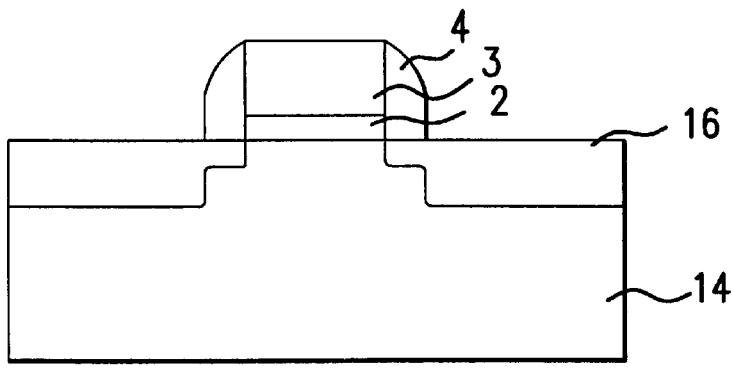
FIGS. 1(A)–(C) are sectional views of the contact area of a semiconductor device according to an embodiment of the invention.

As shown in FIG. 1A, a gate electrode 3 is formed on a semiconductor substrate 14 via a gate oxide film 2. A spacer 4 is formed on a sidewall of the gate electrode 3. An n type diffusion layer 16 is formed in the semiconductor substrate 14.

Figure 1B:
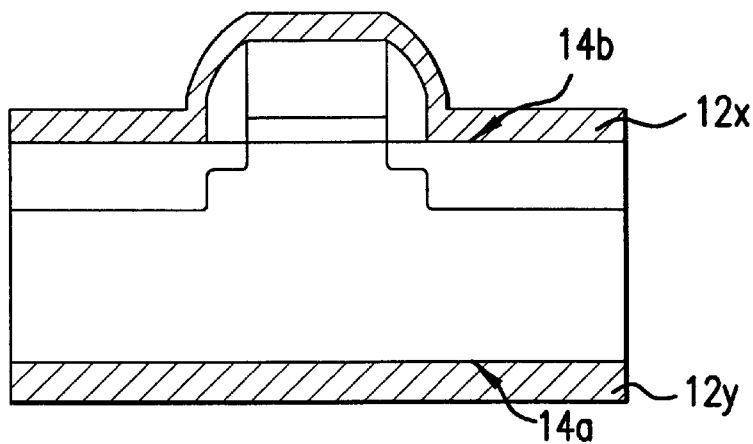

As shown in FIG. 1B, SiO2 films 12x and 12y are formed on an upper surface 14b and a bottom surface 14a of the semiconductor substrate 14, respectively. The Sio2 films 12x and 12y having a thickness of 10 to 20 nm are formed using LP-CVD process.

Figure 1C:
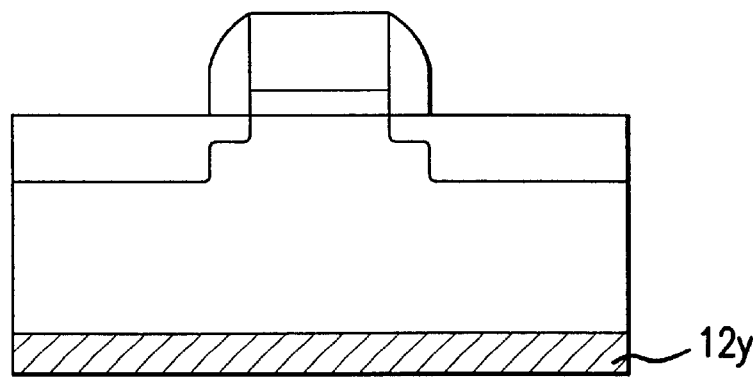

As shown in FIG. 1C, the Sio2 film 12x is removed by dry etching with a chloride gas. As a result, only the SiO2 film 12y remains on the bottom surface 14a of the semiconductor substrate 14.

Figure 2A:
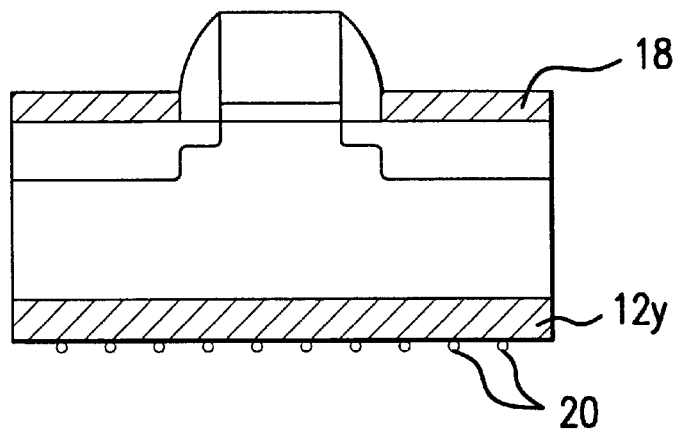
FIGS. 2(A)–(c) are sectional views of the contact area.

As shown in FIG. 2A, a CoSi2 film 18 is formed by CVD on the n type diffusion layer 16 on the upper surface 14b of the semiconductor substrate 14. An undesired cobalt 20 adheres from a carrier to the SiO2 film 12y during transferring the semiconductor substrate 14 using the carrier to an apparatus for the CVD process of the cobalt.

Figure 2B:
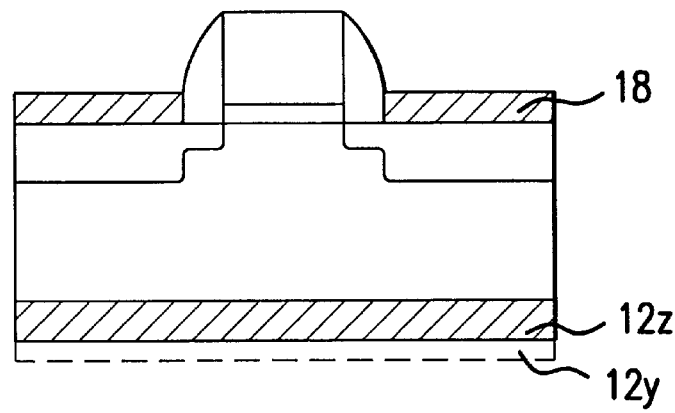

As shown in FIG. 2B, the undesired cobalt 20 is removed from the SiO2 film 12y. Concretely, the structure with the CoSi2 film 18 is put in 0.3% HF aqueous solution for 60 seconds to etch off the undesired cobalt 20.

Figure 2C:
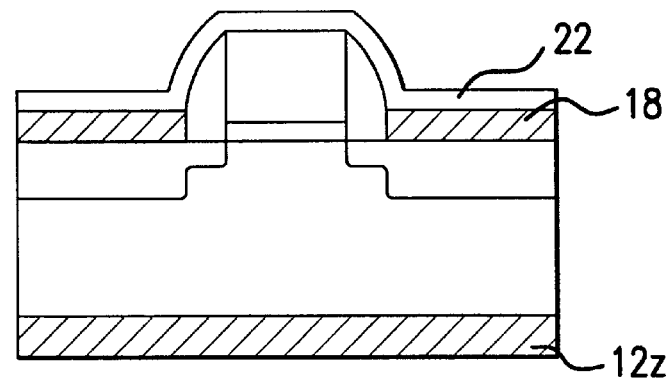

As shown in FIG. 2C, a SiN film 22 is formed on the CoSi2 film 18 by LP-CVD process. Since the undesired cobalt 20 has been removed from the bottom surface 14a of the semiconductor substrate 14, the LP-CVD process does not contaminate the interior of the reactive furnace with the undesired cobalt 20. Also, it does not contaminate other devices with the undesired cobalt 20 in the batch process.

Figure 3A:
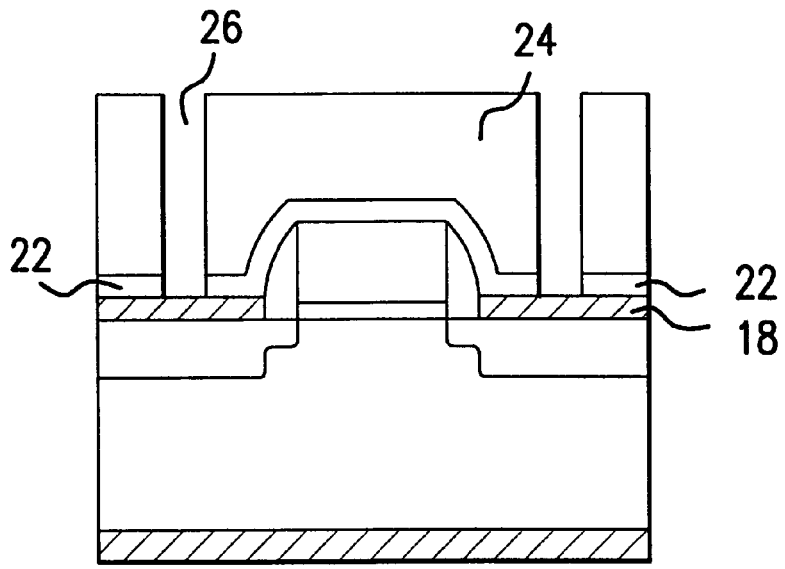
FIGS. 3(A) and (B) are sectional views of the contact area.

As shown in FIG. 3A, an interlayer insulation film 24 is formed on the SiN film 22. Then, cobalt holes 26 are formed in the interlayer insulation film 24 so as to expose the CoSi2 film 18 surface.

Figure 3B:
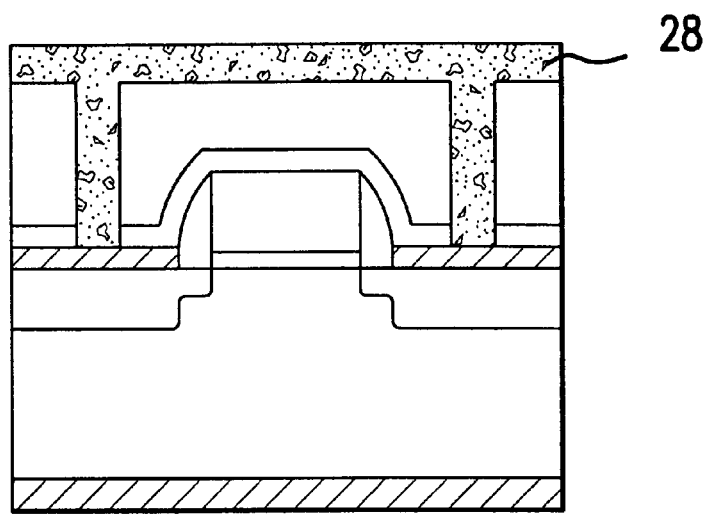

As shown in FIG. 3B, the contact holes 26 are filled with tungsten 28 as interconnections.

Since there is the CoSi2 film 18 between the n+diffusion layer 16 and the wiring tungsten 28a and 28b in the contact area 30, the resistance between the n+diffusion layer 16 and the wiring 28a and 28b is reduced.

Alternatively, the SiO2 film on the back side 10a of the structure 10 is replaced by a SiN film. The SiN film is formed by LP-CVD in the same manner as the SiO2 film. The preferred thickness of the SiN film ranges from 10 to 20 nm. The chemical bond between Si and N in the SiN film is incomplete so that the heavy metal not only adheres to the SiN film but also bonds with Si of the SiN film, thus preventing the heavy metal from diffusing into the silicon substrate from the SiN film. The adhered heavy metal is removed with the HF solution in the same manner as the SiO2 film. The heavy metal makes strong bond with Si of the SiN film but it can be removed along with the SiN film portion that is etched off by the HF.

It should be noted that the present invention is not limited to the illustrated fabrication of the contact area of a DRAM having a gate length of 0.18 um.

As has been described above, according to the invention, an insulation film is formed on the back side of an intermediate structure prior to the process with a heavy metal so that the heavy metal adheres to the insulation film in the heavy metal process, which prevents the heavy metal from diffusing into the structure. The heavy metal is removed from the insulation film prior to the next step so that contamination, by the heavy metal, of the components of a structure is prevented. Also, the other structures in the same batch are not contaminated.

What is claimed is:

1. A method of making a semiconductor device comprising:

forming a gate electrode on a semiconductor substrate;

forming a diffusion layer in the semiconductor substrate;

forming a first SiO2 film on a bottom surface of the semiconductor substrate and forming second SiO2 film on an upper surface of the semiconductor substrate;

removing the second SiO2 film;

forming a CoSi2 film on the diffusion; and removing an undesired cobalt from the first SiO2 film.

2. A method of making a semiconductor device as claimed in claim 1, wherein the first and second SiO2 films are formed using LP-CVD.

3. A method of making a semiconductor device as claimed in claim 1, wherein the second SiO2 film is removed by dry etching.

4. A method of making a semiconductor device as claimed in claim 3, wherein the dry etching is carried by a chloride gas.

5. A method of making a semiconductor device as claimed in claim 1, wherein the undesired cobalt is etched off putting in 0.3% HF aqueous solution for 60 seconds.

6. A method of making a semiconductor device as claimed in claim 1, wherein the undesired cobalt is adhered from a carrier to the second SiO2 film during transferring the semiconductor substrate using the carrier to an apparatus for the CVD process of he cobalt.

7. A method of making a semiconductor device as claimed in claim 1, further comprising:

forming a SiN film on the CoSi2 film;

forming an interlayer insulation film on the SiN film, the interlayer insulation film having contact holes so as to expose the CiSi2 film; and filling the contact holes with tungsten as interconection.

* * * * *